United States Patent [19]

Cheng et al.

[11] Patent Number: 5,049,201
[45] Date of Patent: Sep. 17, 1991

[54] METHOD OF INHIBITING CORROSION IN AN ELECTRONIC PACKAGE

[75] Inventors: Shirley Cheng, Hopewell Junction; Constance J. Araps, Wappingers Falls; Allen J. Arnold, LaGrangeville; Jeffrey T. Coffin, Wappingers Falls; Luu T. Nguyen, Peekskill, all of N.Y.

[73] Assignee: International Business Machines Corporation, Armonk, N.Y.

[21] Appl. No.: 370,355

[22] Filed: Jun. 22, 1989

[51] Int. Cl.$^5$ .............................................. B08B 3/08
[52] U.S. Cl. ........................................ 134/42; 134/2; 252/396
[58] Field of Search ...................... 134/42, 2; 252/396

[56] References Cited

U.S. PATENT DOCUMENTS

| 3,993,123 | 11/1976 | Chu et al. | 165/80 |
| 4,271,425 | 6/1981 | Wong | 357/72 |
| 4,396,796 | 8/1983 | Wong | 174/52 PE |
| 4,711,853 | 12/1987 | Pacey et al. | 436/74 |

OTHER PUBLICATIONS

Ochiai et al., Chemical Abstract 113:61806r (1990).
Gavrilov et al., Chemical Abstract 108:80358j (1987).
Pedersen, C. J., J. American Chemical Society, 89, 7017 (1967).
Truter et al., Endeavour, 30, 142 (1971).
Crown Compounds, Their Characteristics and Applications by Michio Hiraoka, Elsevier Scientific Publishing Company, New York (1982), particularly pp. 1-8, 67-69, 115-124, 137-144, 151-153 and 199-202.

*Primary Examiner*—Asok Pal
*Attorney, Agent, or Firm*—Ira David Blecker

[57] ABSTRACT

Disclosed is a method of inhibiting corrosion on an electronic component. The method includes the steps of obtaining an electronic component and then cleaning the electronic component in a solution consisting of a complexing agent and a solvent in which the complexing agent is soluble. The complexing agent is a crown compound.

20 Claims, No Drawings

METHOD OF INHIBITING CORROSION IN AN ELECTRONIC PACKAGE

FIELD OF THE INVENTION

This invention relates to the field of electronic substrates such as ceramic and glass substrates and printed circuit boards which have one or more electronic devices thereon.

BACKGROUND OF THE INVENTION

Electronic devices such as semiconductor devices and integrated circuits may be mounted on a variety of substrates. These substrates include ceramic and glass substrates as well as printed circuit boards which, for example, may be made from polymeric materials. In any case, one or more electronic devices may be mounted on each substrate.

The substrate and electronic device may be hermetically sealed to protect the device and associated wiring from contamination by the environment. The hermeticity of the package also offers protection against entrapped processing residues. One type of hermetically sealed package is illustrated in Chu et al. U.S. Pat. No. 3,993,123, the disclosure of which is incorporated by reference herein.

The present invention, however, is most concerned with non-hermetic packages (although the invention has applicability to hermetic packages as well), whether they be sealed or not. In this case, the electronic component (substrate or electronic device) may be left uncovered so that it is relatively unprotected from the environment. Alternatively, the electronic component may be encapsulated or covered in some way to offer more protection.

The protection offered by the covering layer (which may also be passivating in nature), however, is not complete. Even the best encapsulation materials are permeable; consequently, they offer only limited protection from the intrusion of gaseous contaminants from the ambient environment and no protection at all from entrapped processing residues.

Recognizing the deficiencies of the encapsulation and covering materials, it has been proposed to add complexing agents to these materials to complex with, and thus eliminate the deleterious effects of, ionic contaminants.

It is known that ionic contaminants, such as sodium, potassium and chlorine, can react with unprotected metallurgies to cause corrosion, and in some cases electromigration, which eventually result in degradation of the electrical integrity of an electronic component. A portion of these ionic contaminants are inherent in the encapsulation and covering materials. Others of the ionic contaminants originate from the material deposited during the processing of the electronic component which is subsequently captured or trapped in pores and basins within the package.

In order to alleviate the problem of ionic contaminants in the encapsulation materials, Wong U.S. Pat. Nos. 4,271,425 and 4,396,796, the disclosures of which are incorporated by reference herein, suggests the incorporation of crown ethers or cryptate ethers in the encapsulation or covering material. Due to the fact that such complexing agents are tied up in the encapsulation or covering material, they are remote from the sites on the substrate and device where other ionic contaminants occur and thus are of limited effectiveness in preventing the corrosion reaction that takes place due to these ionic contaminants. Conventional cleaning of the package prior to encapsulation or covering is generally ineffective in the removal of such ionic contaminants.

Crown ethers and cryptate ethers are both known complexing agents as illustrated by the Wong references. Pacey et al. U.S. Pat. No. 4,711,853, illustrates that potassium may be selectively extracted in the presence of sodium from a solution containing crown ethers. In general, the ability of crown ethers to selectively extract alkali and alkaline earth metal ions has been recognized in the art as reported by Pedersen, C. J., *J. American Chemical Society*, 89, 7017 (1967). Similarly, the ability of cryptate ethers to complex with anions and cations has been reported by, for example, Truter et al., *Endeavour*, 30, 142 (1971). Cryptate ethers and crown ethers can be grouped under the generic classification of crown compounds. The seminal work on crown compounds and their complexing characteristics is "Crown Compounds, their characteristics and applications" by Michio Hiraoka, Elsevier Scientific Publishing Company, New York (1982). The disclosures of these references are incorporated by reference herein.

Notwithstanding the previously known complexing properties of crown compounds and their uses in encapsulating materials for electronic devices, there nevertheless remains a need to improve the inhibition of corrosion in electronic packages.

Accordingly, it is an object of the present invention to improve the inhibition of corrosion in electronic packages.

It is another object of the present invention to inhibit the corrosion in electronic packages in a simple yet effective manner.

These and other objects of the present invention will become more apparent after referring to the following description.

BRIEF SUMMARY OF THE INVENTION

The objects of the invention have been achieved by inventing a method of inhibiting corrosion on an electronic component. In its broadest aspect, the method comprises cleaning the electronic component in a solution which comprises a crown compound.

DETAILED DESCRIPTION OF THE INVENTION

According to the invention, there is disclosed a method of inhibiting corrosion on an electronic component, comprising the steps of:
 a. obtaining an electronic component; and
 b. cleaning said electronic component in a solution comprising a crown compound complexing agent and a solvent in which said complexing agent is soluble.

Crown compounds are well known to those skilled in the art. Their ability to complex with anions and cations is also well known. The choice of which crown compound to use is dictated by many factors such as the particular application under consideration, the ionic species to be trapped, thermal stability and the solvent to be used.

As can be appreciated, there are many crown compounds available for use with the present invention. The choice of which particular crown compound to use will become apparent to those skilled in the art after following the teaching of the present invention.

Generally, when it is desired to complex with cations (such as sodium or potassium), crown ethers are normally chosen. On the other hand, when it is necessary to complex with anions (such as chlorine), cryptate ethers are normally preferred. As a person skilled in the art can appreciate this is not a hard and fast rule. As will become more apparent, hereafter crown ethers may be preferred to complex with particular anions while cryptate ethers may be preferred for particular cations.

There are three types of crown ethers that are of interest to the present invention, namely, alicyclic crown ethers, aromatic crown ethers and cyclic oligomers of ethylene oxide. An example of an alicyclic crown ether is 2,3,11,12,dicyclohexano - 1,4,7,10,13,16 hexaoxacyclooctadecane and may be represented by the following structure:

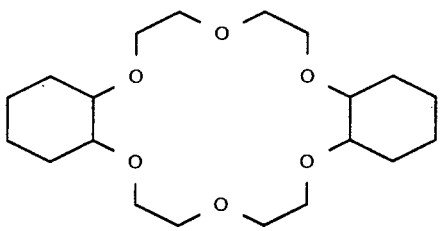

The trivial nomenclature for this crown ether is dicyclohexyl 18-crown-6 crown ether. For purposes of clarity and convenience, the trivial nomenclature will be used often throughout this specification.

Other examples of alicyclic crown ethers, for purposes of illustration and not of limitation, are dicyclohexyl 24-crown-8 crown ether and dicyclohexyl 30-crown-10 crown ether.

An example of an aromatic crown ether is dibenzo 18-crown-6 (2,3,11,12 - dibenzo - 1,4,7,10,13,16-hexaoxacyclo- octadeca - 2,11,diene) crown ether and may be represented by the following structure:

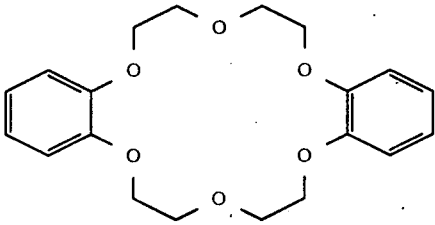

Other examples of aromatic crown ethers, for purposes of illustration and not of limitation, are dibenzo 24-crown-8 crown ether and dibenzo 12-crown-4 crown ether.

An example of a cyclic oligomer of ethylene oxide is 18-crown-6 ( 1,4,7,10,13,16 - hexaoxacyclooctadecane) crown ether and may be represented by the following structure:

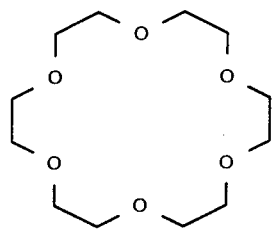

Other examples of these types of ethers, for purposes of illustration and not of limitation, are 15-crown-5 (1,4,7,10,13 - pentaoxacyclopentadecane) crown ether and 12-crown-4 (1,4,7,10 - tetraoxacyclododecane) crown ether.

Crown ethers are readily available from Aldrich Chemical Company, Milwaukee, Wis.

Of these crown ethers, the alicyclic and aromatic crown ethers are the more preferred for the purposes of the present invention. Cyclic oligomers of ethylene oxide, such as 18-crown-6, are usually not preferred for the purposes of the present invention because they are water soluble. While not wishing to be held to any particular theory, it is believed that the reason the present invention is so effective is that after the electronic component is cleaned, there is left a residue of the crown ether which serves to continually capture free ionic contaminants long after the cleaning step is completed. If, then, the crown ether is water-soluble, the crown ether would break down upon exposure to the humidity in the air, thereby losing its effectiveness. There will, however, be many uses for these water-soluble crown ethers notwithstanding their water solubility, and thus they are included within the scope of the present invention.

Of the alicyclic and aromatic crown ethers, the alicyclic crown ethers are clearly preferred due to their greater thermal stability. It is expected that the electronic components which are cleaned will undergo further processing and/or use at elevated temperatures. Accordingly, if it is assumed that there is a residue of crown ether left on the surface of the electronic component, its thermal stability becomes important. It has been found that the most preferred alicyclic crown ether is dicyclohexyl 18-crown-6.

The electronic components of today undergo numerous processing steps before they can be installed. The cleaning of these electronic components may, and it is preferred will, take place subsequent to any processing step or steps in which contaminants are introduced to the electronic component. There may thus be only one cleaning step or a plurality of steps during which the electronic component is cleansed according to the present invention. Further, the cleaning process according to the present invention need not be confined only to those situations where ionic contaminants are introduced to the electronic component. It has been found that the present invention is useful for cleaning electronic components which have been exposed to dirty solvents.

The amount of complexing agent that is added to the solvent is dictated by three factors: cost, amount of contaminant present and its solubility in the solvent. The maximum amount of complexing agent will be limited by its solubility in the solvent which will, in turn, depend on the complexing agent and solvent used.

It is desirable to use the minimum amount of complexing agent possible due to its cost. At a minimum, the complexing agent is added in a small but effective amount to complex with substantially all of the free ionic contaminants present. More specifically, the complexing agent is added in a molar amount at least equal to about the molar amount of free ionic contaminants present. As a practical matter, the complexing agent will be added in an amount equal to about three times that of the free ionic contaminants present. This will afford a margin of safety to the cleaning process.

For the alicyclic and aromatic crown ethers, many organic solvents, both polar and non-polar, are suitable. Examples of polar solvents are tetrahydrofuran (THF), glyme (1,2-dimethoxyethane) and diglyme (diethylene glycol dimethyl ether). Examples of non-polar solvents are acetonitrile, xylene, benzene, hexane and toluene. The preferred solvents are THF and xylene. It has been found useful in the present invention to cleanse the surface of the electronic component with separate solutions comprising polar and non-polar solvents. In this way, the process according to the invention will more effectively remove processing residues.

The cryptates that are of interest to the present invention are the monocyclic and multicyclic cryptates. An example of a monocyclic cryptate is 1,7,10,16 -tetraoxa - 4,13 - diaza cyclooctadecane and may be represented by the following structure:

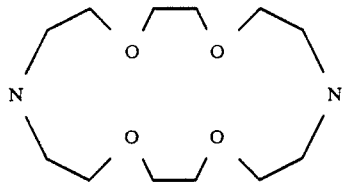

This particular monocyclic cryptate is an aliphatic azacrown ether. Other examples of monocyclic cryptates include aromatic azacrown ethers, alicyclic ethers and heterocyclic azacrown ethers.

An example of a multicyclic cryptate, sometimes also called a cryptand, is 4,7,13,16,21 - pentaoxa -1,10 - diaza bicyclo [8.8.5]tricosane and may be represented by the following structure:

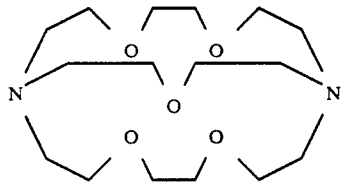

Such a multicyclic cryptate is a bicyclic crown ether. Other examples of multicyclic cryptates are tricyclic crown ethers, spherical cryptands, bicyclic azacrown ethers and anion cryptates.

Cryptates are readily obtainable from EM Science, Cherry Hill, N.J. under the trade name Kryptofix.

Compared to crown ethers, cryptates bind metal ions tightly into the space in their lattices with higher ion selectivity and greater stability of the resulting complexes. In general, the multicyclic cryptates can form more stable complexes than are observed with monocyclic cryptates.

Generally speaking, the rates of dissociation for cryptates are smaller than those for crown ether complexes, thereby indicating that cryptates are thermodynamically more stable than crown ether complexes. Further, cryptates have the ability to complex with transition metal and heavy metal ions better than the corresponding crown ether.

The cryptates are soluble in water and organic solvents, although all cryptates are not soluble in water. Water soluble cryptates are acceptable for use in the present invention because they are not readily susceptible to breaking down in humidity as are the water soluble crown ethers. Organic solvents that may be used include, for example, ethanol, methylamine, diglyme, THF, diethyl ether, and methanol. Unlike the crown ethers, solutions comprising cryptates and polar or non-polar solvents will work equally effectively.

The amount of cryptate that is added to the solvent is dictated by the same considerations that were discussed above with respect to the crown ethers.

It may be found useful to combine a cryptate and a crown ether in a single solution. Such a solution should work satisfactorily so long as a common solvent is utilized. Other combinations of crown compounds are also possible.

Other specific crown compounds not discussed here, such as thiacrown, cyclic azathia and azathiacrown ethers are useful for complexing with other anions and cations. Such other crown compounds are nevertheless included within the scope of the present invention.

The method according to the invention is believed to have wide applicability to many different types and kinds of electronic components. Thus, the electronic component may be an electronic device such as a semiconductor chip or integrated circuit. The electronic component may also be a substrate such as a ceramic (e.g. alumina), glass (e.g. borosilicate) or glass/ceramic (e.g. cordierite) substrate. The process may also be applied to a combination of any of these electronic components.

Further according to the invention, the electronic component or components may be covered with a moisture-resistant material such as a polymeric elastomer such as RTV silicone as disclosed in the Wong patents mentioned previously. Further still, the moisture-resistant material may comprise a crown compound complexing agent. As will become more apparent hereafter, the moisture-resistant material does not provide complete protection by itself but, rather, is supplemental to the present invention.

The advantages of the present invention will become more apparent after referring to the following examples.

EXAMPLES 1

A series of specimens were prepared. Each specimen consisted of a multilayer ceramic alumina substrate having nickel metallurgy thereon. Some of the specimens were deliberately contaminated by doping. The specimens were then immersed in separate solutions of THF and xylene, some of which were fortified with dicyclohexyl 18-crown-6 crown ether (CE). Thereafter, the specimens were dried. Certain of the specimens were then coated with polyisobutylene (PIB) or polyisobutylene containing 0.1 weight percent dicyclohexane 18-crown-6 crown ether. All the specimens were then capped and sealed.

To test the corrosion resistance of the specimens, they were subjected to a controlled environment of 85° C. and 81% relative humidity for 1000 hours under the influence of 10 volts DC bias.

The test results follow in Table I.

TABLE I

| Doping | THF Solution | Xylene Solution | Passivant Overlay | Corrosion |
|---|---|---|---|---|
| .05 mHCl | NO CE | NO CE | PIB + CE | YES |
| .05 mHCl | .002 mCE | .002 mCE | PIB + CE | NO |
| .01 mHCl | NO CE | NO CE | PIB | YES |
| .01 mHCl | .05 mCE | .05 mCE | PIB | NO |
| .01 mHCl | .05 mCE | .05 mCE | NONE | NO |
| .01 mNaOH | NO CE | NO CE | PIB + CE | YES |
| .01 mNaOH | .05 mCE | .05 mCE | PIB | NO |
| .01 mNaOH | .05 mCE | .05 mCE | NONE | NO |
| NONE | NO CE | NO CE | PIB | NO |
| NONE | .05 mCE | .05 mCE | PIB | NO |
| NONE | .05 mCE | .05 mCE | PIB | NO |
| NONE | NO CE | NO CE | PIB + CE | YES |
| NONE | .05 mCE | .05 mCE | PIB + CE | NO |
| NONE | .05 mCE | .05 mCE | PIB + CE | NO |

The test results vividly illustrate that corrosion of the nickel has occurred in all cases but one when cleaning has proceeded with unfortified solvents whereas cleaning of the specimens according to the present invention has had the desired effect of precluding ionic attack. This result holds true even in those cases where the specimens contained a passivant overlay of PIB, which until the present invention had been thought to provide adequate protection.

EXAMPLES 2

A second series of specimens were prepared. Each specimen consisted of a multilayer ceramic alumina substrate having nickel metallurgy thereon. All the specimens were immersed into doping solutions for thirty minutes. Thereafter, most of the specimens were immersed into wash solutions for 10 minutes with constant agitation. Of those specimens that were washed, a portion were immersed in separate solutions of THF and xylene, some of which were fortified with 0.05 mole dicyclohexane - 18 - crown - 6 ether. Other specimens were immersed in 0.05 mole cryptate solutions. The solvent was either water or methanol. The cryptate used was either Kryptofix 22 (1,7,10,16-tetraoxa-4,13-diazacyclo octadecane) or Kryptofix 221 (4,7,13,16,21-pentaoxa-1,10-diazabicylco [8.8.5] tricosane), hereafter referred to as cryptates 1 and 2, respectively. The cryptates and crown ether were added to the wash solutions in equal or greater molar quantities to the ion concentration to be neutralized.

After the wash, all the specimens were dried and exposed to 85° C. and 85% relative humidity for 720 hours. The test results are summarized in Table II.

TABLE II

| Doping | Cleaning Solution | Corrosion |
|---|---|---|
| .05 mHCl | NONE | YES |
| .05 mHCl | THF/XYLENE | YES |
| .05 mHCl | THF/XYLENE/CE | NO |
| .05 mHCl | CRYPTATE 1 (WATER) | NO |
| .05 mHCl | CRYPTATE 1 (METHANOL) | NO |
| .05 mHCl | CRYPTATE 2 (WATER) | NO |
| .05 mHCl | CRYPTATE 2 (METHANOL) | NO |
| .05 mNaCl | NONE | YES |
| .05 mNaCl | THF/XYLENE | YES |
| .05 mNaCl | THF/XYLENE/CE | NO |
| .05 mNaCl | CRYPTATE 1 (WATER) | NO |
| .05 mNaCl | CRYPTATE 1 (METHANOL) | NO |
| .05 mNaCl | CRYPTATE 2 (WATER) | NO |
| .05 mNaCl | CRYPTATE 2 (METHANOL) | NO |
| .05 mNaOH | NONE | YES |
| .05 mNaOH | THF/XYLENE | YES |
| .05 mNaOH | THF/XYLENE/CE | NO |
| .05 mNaOH | CRYPTATE 1 (WATER) | NO |
| .05 mNaOH | CRYPTATE 1 (METHANOL) | NO |
| .05 mNaOH | CRYPTATE 2 (WATER) | NO |
| .05 mNaOH | CRYPTATE 2 (METHANOL) | NO |

The test results indicate that the untreated samples or those only washed in THF and xylene exhibited corrosion of the nickel metallurgy. Those samples which were washed in solutions containing crown ethers or cryptates were found to be devoid of corrosion.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. A method of inhibiting corrosion on an electronic component, comprising the steps of:
   a. obtaining an electronic component; and
   b. cleaning said electronic component in a solution comprising a crown compound complexing agent and a solvent in which said complexing agent is soluble;
   wherein said method inhibits corrosion of an electronic component after removal from said solution.

2. The method of claim 1 wherein said complexing agent is added in a small but effective amount to complex with substantially all free ionic contaminants present.

3. The method of claim 1 wherein said solvent is selected from the group consisting of acetonitrile, xylene, toluene, hexane, benzene, tetrahydrofuran, glyme, diglyme, ethanol, water, methylamine, diethyl ether, and methanol and mixtures thereof.

4. The method of claim 3 wherein said solvent is xylene.

5. The method of claim 3 wherein said solvent is tetrahydrofuran.

6. The method of claim 3 wherein said solvent is water.

7. The method of claim 1 wherein said crown compound complexing agent is selected from the group consisting of crown ethers, cryptate ethers and mixtures thereof.

8. The method of claim 7 wherein said cryptate ether is a monocyclic or multicyclic cryptate.

9. The method of claim 8 wherein said cryptate ether is a multicyclic cryptate.

10. The method of claim 7 wherein said crown ether is an alicyclic crown ether or an aromatic crown ether.

11. The method of claim 10 wherein said crown ether is an alicyclic crown ether.

12. The method of claim 11 wherein said crown ether is dicyclohexyl 18 - crown - 6 crown ether.

13. The method of claim 1 wherein said electronic component is a semiconductor chip.

14. The method of claim 1 wherein said electronic component is an integrated circuit.

15. The method of claim 1 wherein said electronic component is a ceramic substrate.

16. The method of claim 1 wherein said electronic component is a glass/ceramic substrate.

17. The method of claim 1 wherein said electronic component is a glass substrate.

18. The method of claim 1 wherein said electronic component is covered with a moisture-resistant material.

19. The method of claim 18 wherein said moistureresistant material comprises a crown compound complexing agent.

20. The method of claim 19 wherein said crown compound complexing-agent is selected from the group consisting of crown ethers, cyptate ethers and mixtures thereof.

* * * * *